(12) United States Patent
Naoi

(10) Patent No.: US 7,293,219 B2
(45) Date of Patent: Nov. 6, 2007

(54) ERROR CORRECTING DEVICE AND METHOD THEREOF THAT TURBO-DECODES ONLY IF AN ERROR IS DETECTED IN THE RECEIVED DATA

(75) Inventor: Toshimichi Naoi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 436 days.

(21) Appl. No.: 10/460,212

(22) Filed: Jun. 13, 2003

(65) Prior Publication Data

US 2003/0233610 A1 Dec. 18, 2003

(30) Foreign Application Priority Data

Jun. 13, 2002 (JP) ............... 2002-172707

(51) Int. Cl.
*H03M 13/00* (2006.01)

(52) U.S. Cl. ................. 714/758; 714/712

(58) Field of Classification Search .......... 714/758
See application file for complete search history.

(56) References Cited

U.S. PATENT DOCUMENTS

| | | | | |
|---|---|---|---|---|
| 5,479,417 A * | 12/1995 | Tsujimoto | .............. | 714/776 |
| 5,579,303 A * | 11/1996 | Kiriyama | .............. | 370/252 |
| 6,199,190 B1 * | 3/2001 | Wan | .............. | 714/786 |
| 6,567,938 B2 * | 5/2003 | Wan | .............. | 714/701 |
| 6,574,766 B2 * | 6/2003 | Obuchi et al. | .............. | 714/755 |
| 6,792,041 B1 * | 9/2004 | Kim et al. | .............. | 375/225 |
| 6,795,947 B1 * | 9/2004 | Siegel et al. | .............. | 714/802 |
| 6,848,069 B1 * | 1/2005 | Levy et al. | .............. | 714/755 |
| 6,871,314 B2 * | 3/2005 | Ohira et al. | .............. | 714/776 |
| 6,915,465 B2 * | 7/2005 | Fujiwara et al. | .............. | 714/712 |
| 2002/0091982 A1 * | 7/2002 | Ohira et al. | .............. | 714/752 |

* cited by examiner

*Primary Examiner*—Guy Lamarre
*Assistant Examiner*—Sam Rizk
(74) *Attorney, Agent, or Firm*—Volentine & Whitt, P.L.L.C.

(57) ABSTRACT

A method for extracting an information sequence from transmitted data, includes receiving the transmitted data, rearranging the order of the received data, extracting a block coding sequence from the rearranged received data, detecting whether an error exists in the extracted block coding sequence, and decoding the extracted block coding sequence using block decoding to obtain the information sequence if no error is detected in the extracted block coding sequence.

10 Claims, 4 Drawing Sheets

ERROR CORRECTING DEVICE AND METHOD THEREOF THAT TURBO-DECODES ONLY IF AN ERROR IS DETECTED IN THE RECEIVED DATA

BACKGROUND OF THE INVENTION

1. Field of the Invention

The present invention relates, in general, to an error correcting device and a method thereof and, more particularly, to a turbo decoding device and a method thereof.

This is a counterpart of and claims priority to Japanese patent application Ser. No. 172707/2002, filed on Jun. 13, 2002, the subject matter of which is incorporated herein by reference.

2. Description of the Related Art

In a wireless communication system, a transmitter side adds a cyclic redundancy check (CRC) to an information data to be sent, causing a block code data to be generated (CRC coding). The block code data is coded with a turbo code to generate a turbo code data (turbo coding). Then, an order of the turbo code data is arranged for dispersing an error (interleave), and the arranged turbo code data is transmitted.

On the other hand, a conventional receiver side rearranges the order of the transmitted arranged turbo code data (hereinafter "received data") to have the previous order (deinterleave). The rearranged received data is decoded to generate the block code data (turbo decoding). Then, the conventional receiver side detects an error in the decoded block code data with CRC.

However, in the conventional receiver side the rearranged received data is always turbo-decoded. Although an ability of error correcting of turbo decoding is high, it necessitates lots of calculation. As a result, much more time and electric power is required.

SUMMARY OF THE INVENTION

According to one aspect of the present invention, there is provided a method for extracting an information sequence from transmitted data, which includes receiving the transmitted data, rearranging the order of the received data, extracting a block coding sequence from the rearranged received data, detecting whether an error exists in the extracted block coding sequence, and decoding the extracted block coding sequence using block decoding to obtain the information sequence if no error is detected in the extracted block coding sequence.

The novel features of the invention will more fully appear from the following detailed description, appended claims and the accompanying drawings.

DETAILED DESCRIPTION OF THE PREFERRED EMBODIMENTS

The preferred embodiments of the present invention will be described. However, the invention is not limited to the specific embodiments. Moreover, not all the combinations of the characteristics of the present invention described in the embodiments are essential to the present invention.

Figure 1:
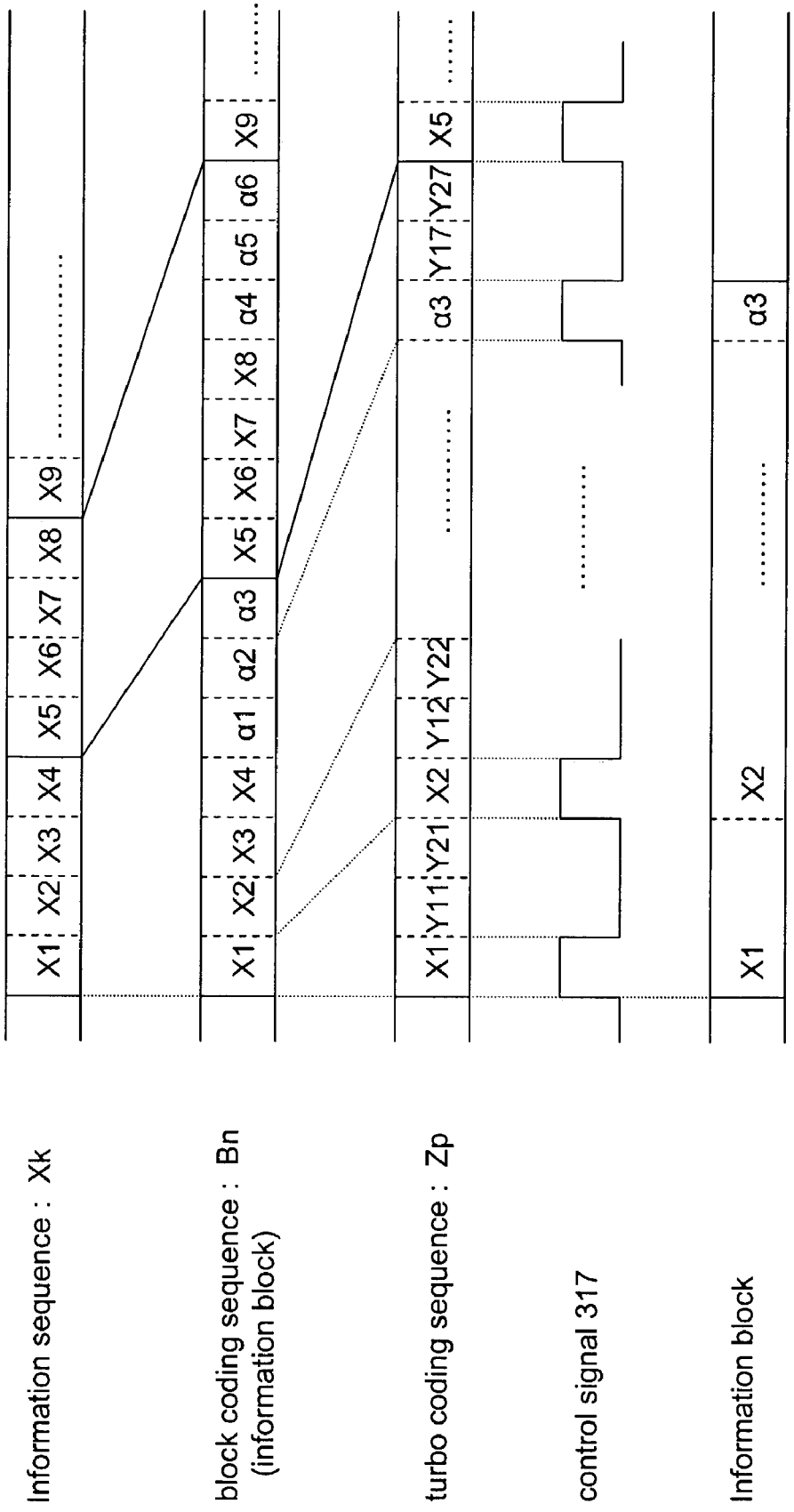
FIG. 1 is a block diagram showing data constructions used in the present invention.
Figure 2:
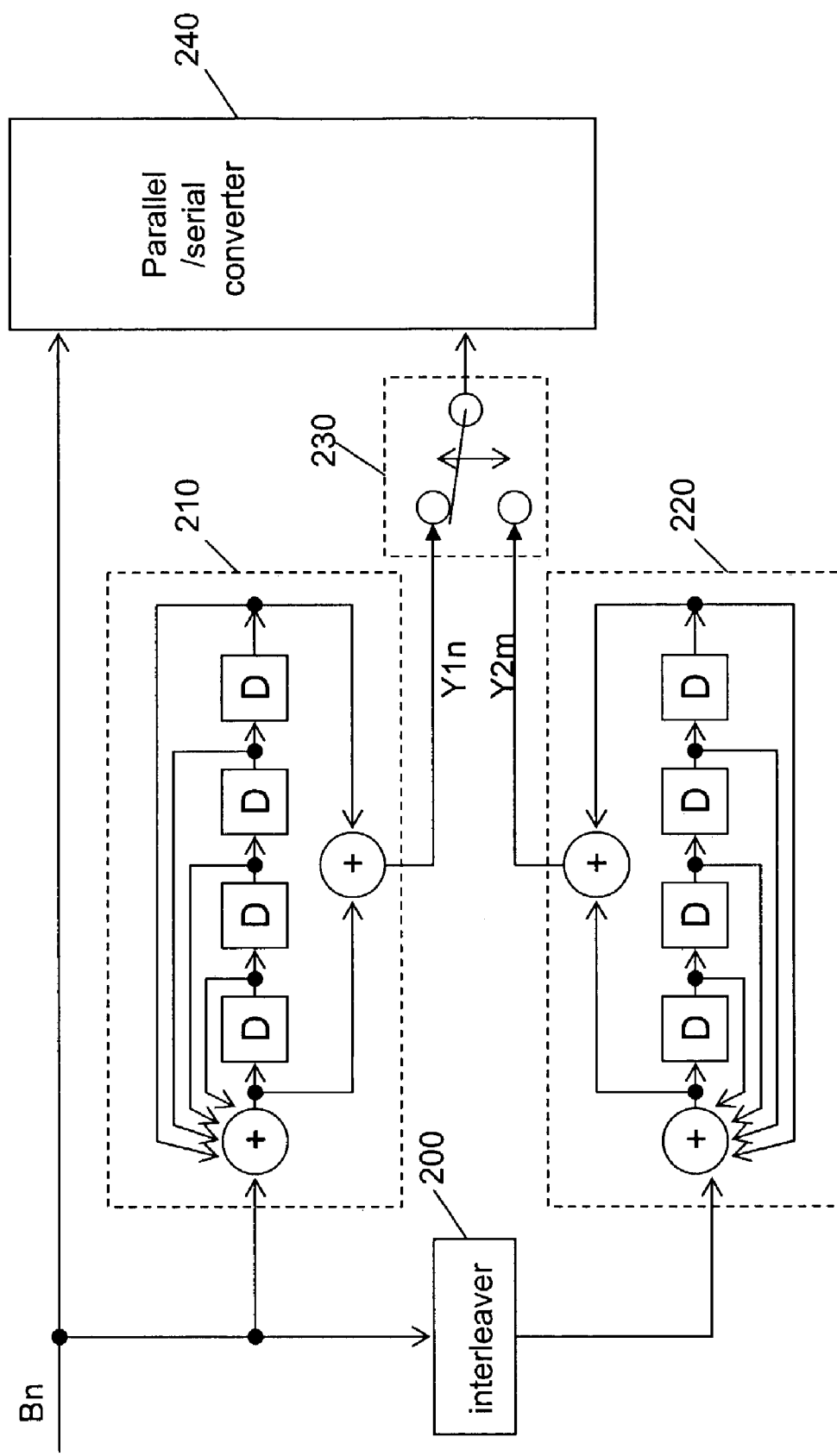
FIG. 2 is a block diagram showing a turbo coder used in the present invention.

The data constructions used in the present invention will be described with reference to FIGS. 1-2. FIG. 1 is a block diagram showing data constructions used in the present invention. FIG. 2 is a block diagram showing a turbo coder used in the present invention. The turbo coder is described in "Turbo Coding", Haruo Hagihara et al., Electro Information Communication, vol. 84 No.3, FIG. 3.

As shown in FIG. 1, an information sequence $Xk$ (k: integer) comprises four bits ($X1$, $X2$, $X3$, $X4$) as an example. The information sequence is coded with a block code to generate the block coding sequence $Bn$ (n: integer) which comprises seven bits ($X1$, $X2$, $X3$, $X4$, $\alpha 1$, $\alpha 2$, $\alpha 3$) as an example. The first four bits are the information sequence $Xk$, and the last three bits are redundancy bits $Pj$ (J: integer). The block code to generate this block coding sequence $Bn$ is called a systematic code.

As shown in FIG. 2, the turbo coder comprises an interleaver 200, element coders 210 and 220, a switch 230 and a parallel/serial converter 240. The block coding sequence $Bn$ is coded by the element coder 210, and a coded data $Y1n$ (n: integer) is generated. On the other hand, an order of the block coding sequence $Bn$ is arranged by the interleaver 200. The arranged block coding sequence $Bn$ is coded by the element coder 220, and a coded data $Y2m$ (m: integer) is generated. The parallel/serial converter 240 outputs the block coding sequence $Bn$, the coded data $Y1n$ and the coded data $Y2m$ in serial (time division multiple). As shown in FIG. 1, the turbo coding sequence $Zp$ (p: integer) is 21 bits ($X1, Y11, Y21, X2, Y12, Y22, X3, \ldots, \alpha 3, Y17, Y27$). As mentioned above, both the block code and the turbo code are the systematic codes.

Figure 3:
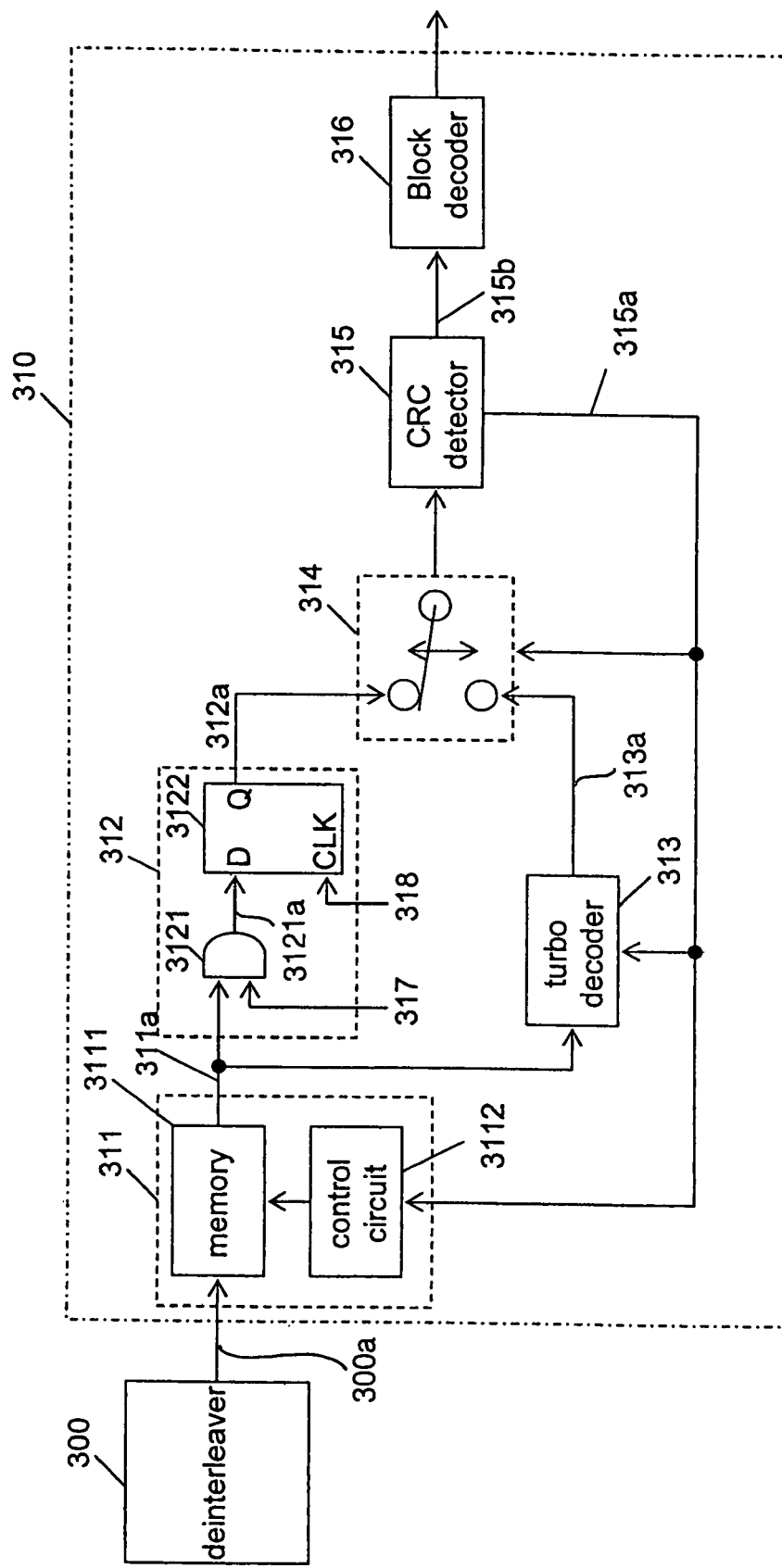
FIG. 3 is a block diagram showing an apparatus of the present invention.

First, the apparatus for extracting an information sequence from transmitted data in a wireless communication system of the present invention will be described with reference to FIG. 3.

The apparatus comprises a deinterleaver 300 and a decoding circuit 310. The apparatus receives a transmitted data. As mentioned above, the transmitted data is the turbo coding sequence $Zp$ an order of which is arranged. The turbo coding sequence $Zp$ is generated by coding the block coding sequence $Bn$ with the turbo code as noted above. Also, the block coding sequence $Bn$ is generated by coding the information sequence $Xk$ with the block code.

The deinterleaver 300 arranges the order of the received data to be in the previous order as it was at the transmitter side, and generates an arranged received data 300a.

The decoding circuit 310 is coupled with the deinterleaver 300. The decoding circuit 310 comprises a storing circuit 311, an information sequence extracting circuit 312, a turbo decoder 313, a switch 314, a cyclic redundancy check (CRC) decoder 315 and a block decoder 316. The storing circuit 311 is coupled with the deinterleaver 300. The storing circuit 311 comprises a memory 3111 and a control circuit 3112. The memory 3111 is DRAM or RAM or the like. The memory 3111 must have the capacity to store at least one unit of received data at a time. The memory 3111 stores the arranged received data 300a. The control circuit 3112 instructs the memory 3111 to output the stored received data 311a according to a control signal 315a.

The information sequence extracting circuit 312 is coupled with the storing circuit 311. The information sequence extracting circuit 312 comprises an AND circuit 3121 and a D-type flip-flop 3122. The AND circuit 3121 is coupled with the storing circuit 311. The AND circuit 3121 extracts the block coding sequence from the stored received data 311a according to a control signal 317. The control signal 317 is generated in a main control circuit. As shown in FIG. 1, the control signal 317 is a pulse signal having a high voltage level for a short time every cycle. The AND circuit 3121 extracts the data from the stored received data 311a when the control signal 317 has a high voltage level. The extracted data 3121a is (X1, X2, X3, ..., α3). If there is no error in the transmitted data, the extracted data 3121a is the same as the block coding sequence Bn. The D-type flip-flop 3122 is coupled with the AND circuit 3121. The D-type flip-flop 3122 latches the extracted data 3121a according to a clock signal 318 which is generated by a central control portion, and outputs the latched data 312a. The information sequence extracting circuit 312 extracts the block coding sequence from the arranged received signal (turbo coding sequence) without turbo decoding. Because, the turbo code is the systematic code, and comprises the block coding sequence Bn and the redundancy bits Yij which is attached after the block coding sequence Bn. Therefore, only if the information sequence extracting circuit 312 extracts the redundancy bits Yij from the stored received data 311a, the block coding sequence Bn is extracted.

The turbo decoder 313 is coupled with the storing circuit 311. The turbo decoder 313 decodes the stored received data 311a according to the control signal 315a, and generates a turbo-decoded data (new block coding sequence) 313a. The switch 314 is coupled with the information sequence extracting circuit 312 and the turbo decoder 313. The switch 314 outputs either the latched data 312a or the turbo-decoded data 313a according to the control signal 315a. The CRC detector 315 detects whether an error exists in the latched data 312a or the turbo-decoded data 313a, and outputs the control signal 315a, the latched data 312a or the turbo-decoded data 313a and a detection result 315b which shows whether an error is detected or not. The block decoder 316 decodes the latched data 312a or the turbo-decoded data 313a.

Figure 4:
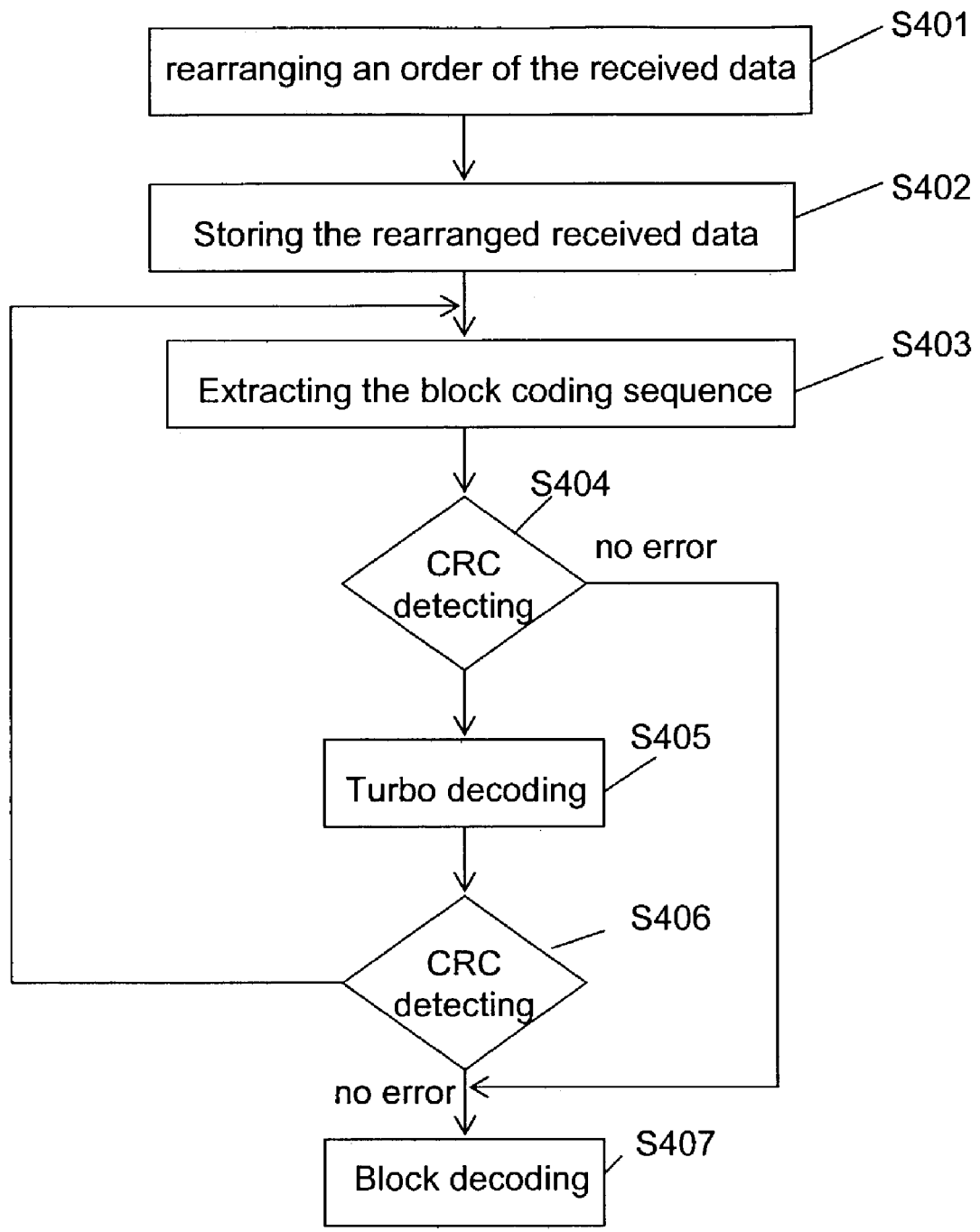
FIG. 4 is a flow chart showing an operation of the apparatus of the present invention.

Next, an operation of the apparatus for extracting an information sequence from transmitted data in a wireless communication system of the present invention will be described reference to FIG. 4. FIG. 4 is a flow chart showing an operation of the apparatus of the present invention.

The deinterleaver 300 arranges an order of the received data to be in the previous order as it was at the transmitter side (S401). The memory 3111 of the storing circuit 311 stores the arranged received data 300a (S402). The control circuit 3112 of the storing circuit 311 instructs the memory 3111 to output the stored received data 311 a, according to the control signal 315a. The AND circuit 3121 extracts the data from the stored received data 311a according to the control signal 317. The D-type flip-flop 3122 of the information sequence extracting circuit 312 latches the extracted data 3121a according to the clock signal 318, and outputs the latched data 312a (S403). The switch 314 electrically connects the information sequence extracting circuit 312 and the CRC detector 315. The CRC detector 315 detects whether an error exists in the latched data 312a (S404). If no error is detected in the latched data 312a, the latched data 312a and a CRC detection result 315b are output to the block decoder 316. The block decoder 316 decodes the latched data 312a (S407).

On the other hand, if error is detected in the latched data 312a (S407), the CRC detector 315 outputs the control signal 315a having a high voltage level. The turbo decoder 313 decodes the stored received data 311a according to the control signal 315a, and generates the turbo-decoded data 313a (S405). The switch 314 electrically connects the turbo decoder 313 and the CRC detector 315. The CRC detector 315 detects whether an error exists in the turbo-decoded data 313a (S406). If no error is detected in the turbo-decoded data 313a, the turbo-decoded data 313a and a CRC detection result 315b are output to the block decoder 316. The block decoder 316 decodes the turbo-decoded data 313a (S407). If error is detected in the turbo-decoded data 313a, the control circuit 3112 instructs the memory 3111 to output next arranged transmitted data 300a.

According to the apparatus for extracting an information sequence from received data in a wireless communication system and the method thereof, first, the received data is detected using CRC. Then, if no error is detected in the received data, the apparatus and method of the present invention does not turbo-decode. On the other hand, if error is detected in the received data, the apparatus and method of the present invention turbo-decodes the received data. Therefore, the apparatus and method of the present invention prevent electric power consumption from increasing.

While the preferred form of the present invention has been described, it is to be understood that modifications will be apparent to those skilled in the art without departing from the spirit of the invention.

The scope of the invention, therefore, is to be determined solely by the following claims.

What is claimed:

1. A method for extracting an information sequence in a block coding sequence from transmitted data, the transmitted data being coded with a turbo code, comprising:

extracting the block coding sequence from the transmitted data;

detecting whether an error exists in the extracted block coding sequence by using a Cyclic Redundancy Check (CRC);

decoding the transmitted data by using turbo decoding if an error is detected in the block coding sequence;

extracting the information sequence from the extracted block coding sequence when an error is not detected during said detecting; and extracting the information sequence from the decoded transmitted data when an error is detected during said detecting.

2. A method for extracting an information sequence from transmitted data in a wireless communication system, the information sequence of the transmitted data being coded with a block code to obtain a block coding sequence, an order of the block coding sequence being arranged, and the block coding sequence and the arranged block coding sequence being coded with a turbo code to obtain a turbo coding sequence as the transmitted data, the method comprising:

receiving the transmitted data;

rearranging the order of the received data;

extracting the block coding sequence from the rearranged received data;

detecting whether an error exists in the extracted block coding sequence;

decoding the extracted block coding sequence using block decoding to obtain the information sequence if no error is detected in the extracted block coding sequence;

decoding the rearranged received data using a turbo decoding to obtain a new block coding sequence if an error is detected in the extracted block coding sequence;

detecting whether an error exists in the new block coding sequence; and decoding the new block coding sequence using the block decoding to obtain the information sequence if no error is detected in the new block coding sequence.

3. The method according to claim 2, further comprising:
storing the rearranged received data; and
providing the stored rearranged received data for said extracting responsive to a control signal.

4. The method according to claim 3, further comprising generating the control signal according to a detection result in said detecting whether an error exists.

5. The method according to claim 2, wherein said detecting whether an error exists uses a Cyclic Redundancy Check (CRC).

6. An apparatus for extracting an information sequence in a block coding sequence from transmitted data, the transmitted data being coded with a turbo code, comprising:

a first extractor that extracts the block coding sequence from the transmitted data;

a detector that detects whether an error exists in the extracted block coding sequence;

a decoder that decodes the transmitted data by using turbo decoding if an error is detected in the extracted block coding sequence; and a second extractor that extracts the information sequence from the extracted block coding sequence when an error is not detected by the detector and that extracts the information from the decoded transmitted data when an error is detected by the detector.

7. An apparatus for extracting an information sequence of the transmitted data in a wireless communication system, the information sequence of the transmitted data being coded with a block code code to obtain a block coding sequence, an order of block coding sequence being arranged, and the block coding sequence, an order of the block coding sequence being arranged, and the block coding sequence and the arranged block coding sequence being coded with turbo code to obtain a turbo coding sequence as the transmitted data, the apparatus comprising:

a deinterleaver that rearranges an order of the transmitted data received by the apparatus;

an extractor that extracts the block coding sequence from the rearranged received data;

a detector that detects whether an error exists in the extracted block coding sequence;

a decoder that decodes the extracted block coding sequence using block decoding to obtain the information sequence if no error is detected in the extracted block coding sequence; and a second decoder that decodes the rearranged received data using turbo decoding to obtain a new block coding sequence if an error is detected in the extracted block coding sequence, wherein said detector detects whether an error exists in the new block coding sequence, and said first decoder decodes the new block coding sequence using the block decoding to obtain the information sequence if no error is detected in the new block coding sequence.

8. The apparatus according to claim 7, further comprising:
a memory that stores the rearranged received data, and outputs the stored rearranged received data to said extractor responsive to a control signal.

9. The apparatus according to claim 8, wherein said detector generates the control signal according to a detection result made by said detector.

10. The apparatus according to claim 7, wherein said detector uses a Cyclic Redundancy Check (CRC).

* * * * *